(12) United States Patent
Soda et al.

(10) Patent No.: US 10,804,311 B2
(45) Date of Patent: Oct. 13, 2020

(54) SEMICONDUCTING DEVICE, AND APPLIANCE HAVING THE SEMICONDUCTING DEVICE

(71) Applicant: CANON KABUSHIKI KAISHA, Tokyo (JP)

(72) Inventors: Takehiko Soda, Yokohama (JP); Kazutoshi Torashima, Yokohama (JP); Yasushi Nakata, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 25 days.

(21) Appl. No.: 16/363,328

(22) Filed: Mar. 25, 2019

(65) Prior Publication Data

US 2019/0305028 A1 Oct. 3, 2019

(30) Foreign Application Priority Data

Mar. 30, 2018 (JP) .................................. 2018-068576

(51) Int. Cl.
*H01L 27/146* (2006.01)
*H01L 23/498* (2006.01)

(52) U.S. Cl.
CPC .. *H01L 27/14634* (2013.01); *H01L 23/49822* (2013.01); *H01L 23/49838* (2013.01); *H01L 27/14636* (2013.01)

(58) Field of Classification Search
CPC ......... H01L 27/14634; H01L 23/49822; H01L 23/49838; H01L 27/14636; H01L 25/50
See application file for complete search history.

(56) References Cited

U.S. PATENT DOCUMENTS

| | | |
|---|---|---|
| 2013/0285180 A1 | 10/2013 | Wang et al. |
| 2014/0042299 A1 | 2/2014 | Wan et al. |
| 2015/0163403 A1* | 6/2015 | Wakabayashi ..... H04N 5/37455 348/308 |

FOREIGN PATENT DOCUMENTS

| | | |
|---|---|---|
| JP | 2012-244331 A | 12/2012 |
| JP | 2015-179859 A | 10/2015 |
| JP | 2017-117828 A | 6/2017 |
| WO | 2017/110482 A1 | 6/2014 |

* cited by examiner

*Primary Examiner* — Kyoung Lee
(74) *Attorney, Agent, or Firm* — Canon U.S.A., Inc. IP Division

(57) ABSTRACT

A first conductive pattern and a third conductive pattern are joined to each other in a junction plane, and a second conductive pattern and a fourth conductive pattern are joined to each other in the junction plane, and an insulation layer is arranged at least in one of spaces between the first conductive pattern and the second conductive pattern and between the third conductive pattern and the fourth conductive pattern.

20 Claims, 8 Drawing Sheets

SEMICONDUCTING DEVICE, AND APPLIANCE HAVING THE SEMICONDUCTING DEVICE

BACKGROUND OF THE INVENTION

Field of the Invention

The aspect of the embodiments relates to a semiconducting device in which a plurality of chips are stacked, and to an appliance having the semiconducting device.

Description of the Related Art

In a semiconducting device in which a plurality of chips are stacked, wirings can be formed which electrically connect chips to each other via a junction portion of a conductive pattern, by joining the conductive patterns of the respective chips.

In Japanese Patent Application Laid-Open No. 2017-117828, a configuration is disclosed in which a power supply voltage (VSS 22 in Japanese Patent Application Laid-Open No. 2017-117828) is supplied from one chip to another chip via a plurality of Cu-Cu junction portions.

SUMMARY OF THE INVENTION

According an aspect of the embodiments, a semiconducting device comprises: a first chip having a plurality of pixels that are arranged over a plurality of rows and a plurality of columns, each pixel having a photoelectric conversion unit and an output node which outputs a signal level corresponding to an electric charge of the photoelectric conversion unit; a plurality of signal lines to which the output nodes of the respective pixels in the plurality of rows of a corresponding column among the plurality of columns are connected, respectively; and a second chip in which a plurality of cells are arranged, wherein the first chip has a first conductive pattern and a second conductive pattern which are connected to one signal line among the plurality of signal lines, respectively, the first conductive pattern and the second conductive pattern each containing copper as a main component; and the second chip has a third conductive pattern and a fourth conductive pattern which are connected to one cell among the plurality of cells, respectively, the third conductive pattern and the fourth conductive pattern each containing copper as a main component, wherein the first conductive pattern and the third conductive pattern are joined to each other on a junction plane, and the second conductive pattern and the fourth conductive pattern are joined to each other on the junction plane; and an insulation layer is arranged at least in one of spaces between the first conductive pattern and the second conductive pattern, and between the third conductive pattern and the fourth conductive pattern.

Further features of the disclosure will become apparent from the following description of exemplary embodiments with reference to the attached drawings.

DESCRIPTION OF THE EMBODIMENTS

Figure 1A:
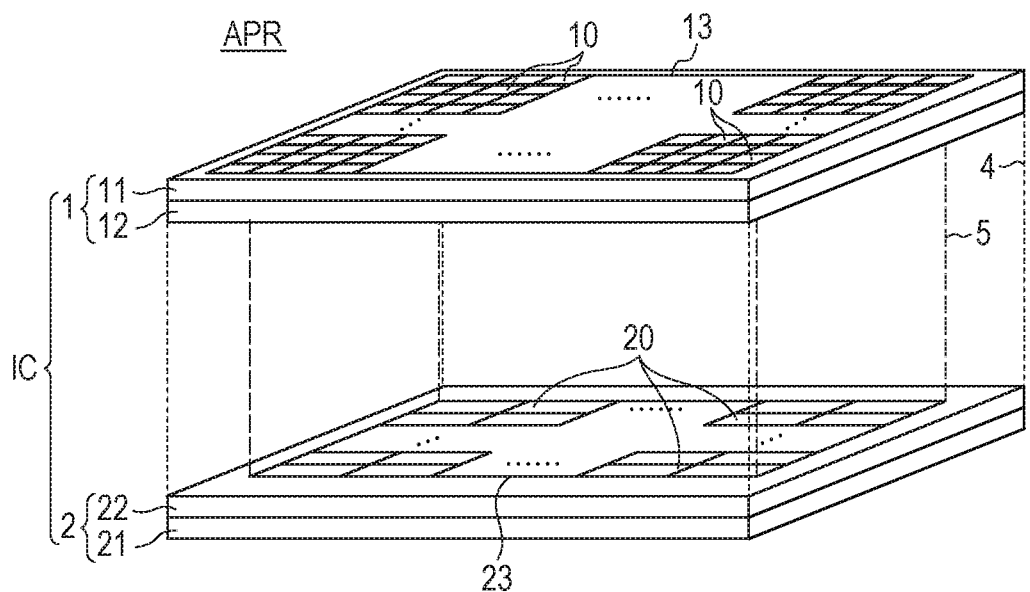
FIGS. 1A and 1B illustrate schematic views of a semiconducting device.

Exemplary embodiments of the disclosure will now be described in detail in accordance with the accompanying drawings.

In Japanese Patent Application Laid-Open No. 2017-117828, the investigation is not made which relates to connection between chips regarding a path for transmitting a pixel signal output by a pixel therethrough. Accordingly, when there has been a connection failure of the connection between the chips in the path for transmitting the pixel signal therethrough, the pixel signal results in being not transmitted to another chip.

The aspect of the embodiments relates to the connection between the chips in the path for transmitting the pixel signal, which has been investigated.

Embodiments for carrying out the disclosure will be described below with reference to the drawings. In the following description and the drawings, common reference characters are assigned to common components throughout the plurality of drawings. For this reason, the plurality of drawings are mutually referred to, common components will be described, and descriptions of the components to which the common reference characters are assigned will be appropriately omitted. Incidentally, the disclosed content of the embodiments includes not only what is specified in the present specification, but also all matters that can be grasped from the present specification and drawings attached to the present specification. In addition, the components which have a similar name but to which different reference characters are assigned can be distinguished by being named as the first component, the second component, the third component and the like.

Exemplary Embodiment 1

FIG. 1A illustrates a semiconducting device APR. The whole or a part of the semiconducting device APR is a semiconductor device IC which is a laminated body of a chip 1 and a chip 2. The semiconducting device APR of the present example is, for example, a photoelectric conversion device that can be used as an image sensor, an AF (Auto Focus) sensor, a photometry sensor and a focus sensor. In the semiconducting device APR, the chip 1 on which a plurality of cells 10 are arranged over a plurality of rows and a plurality of columns is laminated with the chip 2 on which a plurality of cells 20 are arranged over a plurality of rows and a plurality of columns. The cell 20 can include a P-type transistor and an N-type transistor. A line 4 in FIG. 1A shows that the outlines of the chip 1 and the chip 2 substantially coincide with each other, and that the chip 1 and the chip 2 are laminated. The chip 1 has an area 13 in which the plurality of cells 10 are arranged in a matrix form, and the chip 2 has an area 23 in which the plurality of cells 20 are arranged in the matrix form. The area 13 and the area 23 overlap each other in an overlapped region 5. The whole of the area 13 and the whole of the area 23 may overlap each other, but a part of the area 13 may not overlap the area 23, and a part of the area 23 may not overlap the area 13. FIG. 1A illustrates a case where the areas of the area 13 and the area 23 are equal, but there can be a case where the areas of the area 13 and the area 23 are different from each other.

The chip 1 includes: a semiconductor layer 11 in which a plurality of semiconducting elements (unillustrated) constituting the plurality of cells 10; and a wiring structure 12 that includes M layers of wiring layers (unillustrated) constituting the plurality of cells 10. The chip 2 includes: a semiconductor layer 21 in which a plurality of semiconducting elements (unillustrated) constituting the plurality of cells 20; and a wiring structure 22 that includes N layers of wiring layers (unillustrated) constituting the plurality of cells 20. The wiring structure 12 is arranged between the semiconductor layer 11 and the semiconductor layer 21. The wiring structure 22 is arranged between the wiring structure 12 and the semiconductor layer 21.

As will be described in detail later, the cell 10 is a pixel circuit, and includes a photoelectric conversion element such as a photodiode and an active element such as a transistor. The cell 20 is an electric circuit for driving the cell 10 and processing a signal from the cell 10.

Figure 1B:
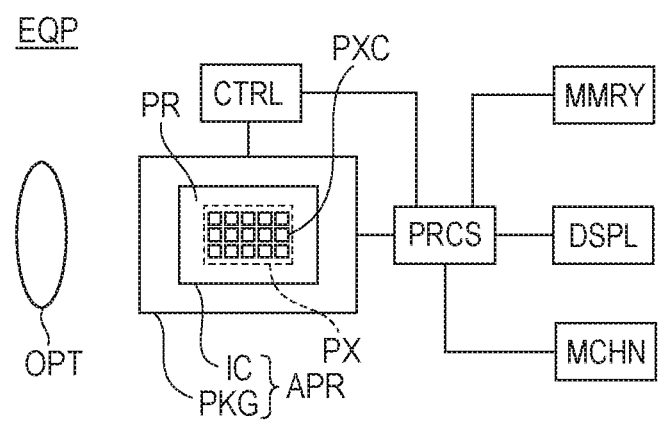

FIG. 1B illustrates an appliance EQP provided with the semiconducting device APR. The semiconductor device IC has a pixel area PX in which pixels PXC including the cells 10 are arrayed in a matrix form. The pixel PXC can include a microlens and a color filter in addition to the photoelectric conversion element included in the cell 10. The semiconductor device IC can have a peripheral area PR around the pixel area PX. A circuit other than the cell 10 can be arranged in the peripheral area PR. The semiconducting device APR can include a package PKG for storing a semiconductor device IC in addition to the semiconductor device IC. The appliance EQP can further include at least any of an optical system OPT, a control device CTRL, a processing apparatus PRCS, a display device DSPL, a storage device MMRY and a mechanical device MCHN. The processing apparatus PRC is a signal processing unit that generates an image using signals output by the semiconducting device APR.

Figure 2:
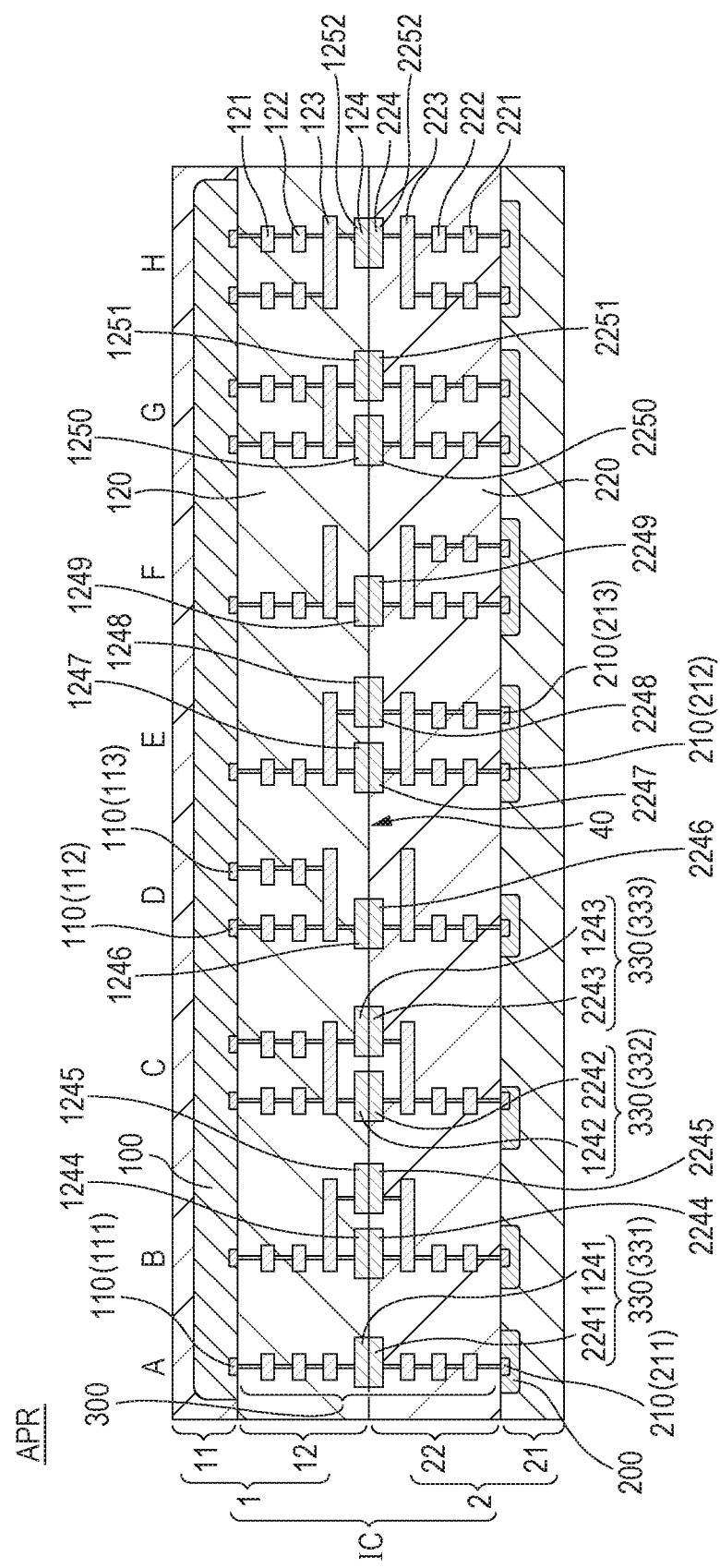
FIG. 2 illustrates a schematic view of the semiconducting device.

FIG. 2 is a cross-sectional view of the semiconducting device APR including the overlapped region 5 illustrated in FIG. 1A. The wiring structure 12 includes wiring layers 121, 121, 123 and 124 as M layers of the wiring layers (M=4, in the present example). An interlayer insulation film 120 is provided around the plurality of wiring layers 121, 121, 123 and 124. The lowermost wiring layer is the wiring layer 124. The wiring layer 124 includes a plurality of conductive patterns 1241, 1242 and 1243 arranged in the chip 1. The wiring structure 22 includes wiring layers 221, 221, 223 and 224 as N layers of the wiring layers (N=4, in the present example). An interlayer insulation film 220 is provided around the plurality of wiring layers 221, 221, 223 and 224. The uppermost wiring layer is the wiring layer 224. The wiring layer 224 includes a plurality of conductive patterns 2241, 2242 and 2243 arranged in the chip 2.

A plurality of wires 300 (wiring between chips) which are formed from the wiring structures 12 and 22 and electrically connect the chip 1 and the chip 2 are provided between the semiconductor layer 11 and the semiconductor layer 21. Incidentally, in the chip 1 and the chip 2, wires only inside the chip (wiring in the chip) can be provided, but the description will be omitted here. Each of the plurality of wires 300 has a junction portion 330 between any one of the plurality of conductive patterns 1241, 1242 and 1243 arranged in the chip 1 and any one of the plurality of conductive patterns 2241, 2242 and 2243 arranged in the chip 2. For example, in a junction portion 331 among the plurality of junction portions 330, the conductive pattern 1241 and the conductive pattern 2241 are joined to each other. In a junction portion 332 among the plurality of junction portions 330, the conductive pattern 1242 and the conductive pattern 2242 are joined to each other. In a junction portion 333 among the plurality of junction portions 330, the conductive pattern 1243 and the conductive pattern 2243 are joined to each other. These junction portions 330 are electrically conducted with contacts 110 of the semiconductor layer 11 via the other wiring layers 121, 121 and 123. These junction portions 330 are electrically conducted with contacts 210 of the semiconductor layer 21 via the other wiring layers 221, 221 and 223. Thereby, the chip 1 and the chip 2 are electrically connected to each other. Incidentally, in order to strengthen a mechanical connection between the chip 1 and the chip 2, the interlayer insulation film 120 and the interlayer insulation film 220 are joined to each other. The conductive patterns are joined to each other and the interlayer insulation films are joined to each other both in a junction plane 40. A main component of a constituent element of each of the conductive patterns is copper. Each of the conductive patterns can be formed from an alloy of aluminum and copper, but in this case, the alloy is formed so that copper is contained more than aluminum so that copper becomes the main component.

The present embodiment includes a plurality of types of wires 300 being provided in the overlapped region 5. In FIG. 2, eight types of the wires 300 of types A, B, C, D, E, F, G and H are illustrated as the types of the wires 300. For example, a wire 300 of a type A is configured to include one junction portion 331. For example, a wire 300 of a type C is configured to include two junction portions 332 and 333. For example, a wire 300 of a type D is configured to include two contacts 112 and 113. For example, a wire 300 of a type E is configured to include two contacts 212 and 213.

Table 1 shows the number of the contacts 110, the junction portions 330 and the contacts 210, in each type of the wires 300. The number of the contacts 110 between the wires 300 of each of the types A, B, C, D, E, F, G and H among the plurality of wires 300 and the semiconductor layer 11 of the chip 1 shall be represented by X. The number of the junction portions 330 included in the wires 300 of each of the types A, B, C, D, E, F, G and H among the plurality of wires 300 shall be represented by Y. The number of the contacts 210 between the wires 300 of each of the types A, B, C, D, E, F, G and H among the plurality of wires 300 and the semiconductor layer 21 of the chip 2 shall be represented by Z.

In Table 1, the numbers that can be taken by each of the numbers X, Y and Z in the wires 300 of each of the types A, B, C, D, E, F, G and H are schematically represented by S and L. Here, a relationship of $1 \leq S < L$ holds. In the example of FIG. 2, S=1 and L=2, but it is acceptable that S=2 and L=3, for example.

TABLE 1

| | Type | | | | | | | |
|---|---|---|---|---|---|---|---|---|
| Number | A | B | C | D | E | F | G | H |
| X | S | S | L | L | S | S | L | L |
| Y | S | L | L | S | L | S | L | S |
| Z | S | S | S | S | L | L | L | L |

TABLE 1-continued

| Number | Type | | | | | | | |
|---|---|---|---|---|---|---|---|---|
| | A | B | C | D | E | F | G | H |
| X/Y | = | − | = | + | − | = | = | + |
| Z/Y | = | − | − | = | = | + | = | + |

A ratio of the number X of the contacts 110 between the wires 300 and the semiconductor layer 11 of the chip 1, to the number Y of the junction portions 330 included in the wires 300 of each of the types A, B, C, D, E, F, G and H shall be represented by X/Y. A type satisfying X/Y>1 (that is, X>Y) is represented by "+", a type satisfying X/Y=1 (that is, X=Y) is represented by "=", and a type satisfying X/Y<1 (that is, X<Y) is represented by "−", respectively.

A ratio of the number Z of the contacts 210 between the wires 300 and the semiconductor layer 21 of the chip 2, to the number Y of the junction portions 330 included in the wires 300 of each of the types A, B, C, D, E, F, G and H shall be represented by Z/Y. A type satisfying Z/Y>1 (that is, Z>Y) is represented by "+", a type satisfying Z/Y=1 (that is, Z=Y) is represented by "=", and a type satisfying Z/Y<1 (that is, Z<Y) is represented by "−", respectively.

As shown in Table 1, X/Y="+" for the types D and H, X/Y is "=" for the types A, C, F and G, and X/Y is "−" for the types B and E. Z/Y="+" for the types F and H, Z/Y is "=" for the types A, D, E and G, and Z/Y is "−" for the types B and C.

At least two types of the wires 300 among the wires 300 of each of the types A, B, C, D, E, F, G and H can be provided in the overlapped region 5. In that case, the number Y of the junction portions included in a certain wire 300 among the plurality of wires 300 in the overlapped region 5 is larger than the number Y of the junction portions included in another wire 300 among the plurality of wires 300 in the overlapped region. As shown in Table 1, Y=L for the types B, C, E and G, and Y=S for the types A, D, F and H. Because of this, in the overlapped region 5, a wire 300 of any one type of the types B, C, E and G, and a wire 300 of any one type of the types A, D, F and H may be provided. Thus, by differentiating the number Y of the junction portions in one wire 300 according to each of the wires 300, the reliability and characteristics of each of the wires 300 can be optimized. For example, the larger is the number of junction portions included in the wire 300, the lower the resistance of the wire 300 can be made. On the other hand, the parasitic capacitance of the wire 300 increases, when the number of the junction portions increases.

In the overlapped region 5, at least two types of wires 300 among the wires 300 of each type A, B, C, D, E, F, G and H can be provided. In that case, the ratio X/Y in a certain wire 300 among the plurality of wires 300 in the overlapped region 5 is larger than the ratio X/Y in another wire 300 among the plurality of wires 300 in the overlapped region 5. Because of this, in the overlapped region 5, any type of wire 300 between types D and H and any type of wire 300 between types B and E may be provided. Alternatively, in the overlapped region 5, any type of wire 300 between types D and H and any type of wire 300 among types A, C, F and G may be provided. Alternatively, in the overlapped region 5, any type of wire 300 among types A, C, F and G and any type of wire 300 between types B and E may be provided. Thus, by making the ratio X/Y in one wire 300 different among each of the wires 300, the way of branching of the wire 300 and the way of sharing of the junction portion can be optimized.

The number of contacts X and Y may be the number of transistors to which one wire 300 is connected. Suppose that the number of transistors of the chip 1 connected to a certain wire 300 is X, and the number of junction portions 330 included in the certain wire 300 is Y. Suppose that the number of transistors of the chip 2 connected to another wire 300 is Z, and the number of junction portions 330 included in another wire 300 is Y. At this time, the ratio X/Y is larger than the ratio Z/Y.

Table 2 shows examples of other types of wire 300 than the types shown in Table 1. The difference from the examples in Table 1 is that the number M is considered in addition to the number S and the number L. Specifically, there are types AF, J, JK, K, BE, P, PQ, Q, R, RT, TU, U, UV, V, DH, HW, W, WC and CG. Here, a relationship of S<M<L holds. By the use of the wire 300 like the type K, for example, in which the number X, the number Y and the number Z are mutually different, the wiring between chips can be optimized. In addition, also by setting at least one of X, Y and Z in each wire 300 at three or more types, the wiring between the chips can be optimized.

TABLE 2

| Number | Type | | | | | | | | | | | | | | | | | | |
|---|---|---|---|---|---|---|---|---|---|---|---|---|---|---|---|---|---|---|---|
| | AF | J | JK | K | BE | P | PQ | Q | R | RT | TU | U | UV | V | DH | HW | W | WC | CG |
| X | S | S | S | S | S | M | M | M | M | M | M | M | M | L | L | L | L | L | L |
| Y | S | M | M | M | L | S | S | S | M | M | M | L | L | L | S | M | M | M | L |
| Z | M | S | M | L | M | S | M | L | S | M | L | S | M | L | M | S | M | L | M |
| X/Y | = | + | + | + | + | − | − | − | = | = | = | + | + | + | − | − | − | − | = |
| Z/Y | − | − | = | + | − | = | + | + | − | = | + | − | − | = | + | − | = | + | − |

A more specific configuration of the cell 10 and the cell 20 and a combination of the wires 300 connected to the cells 10 and 20 will be described with reference to FIG. 3.

Figure 3:
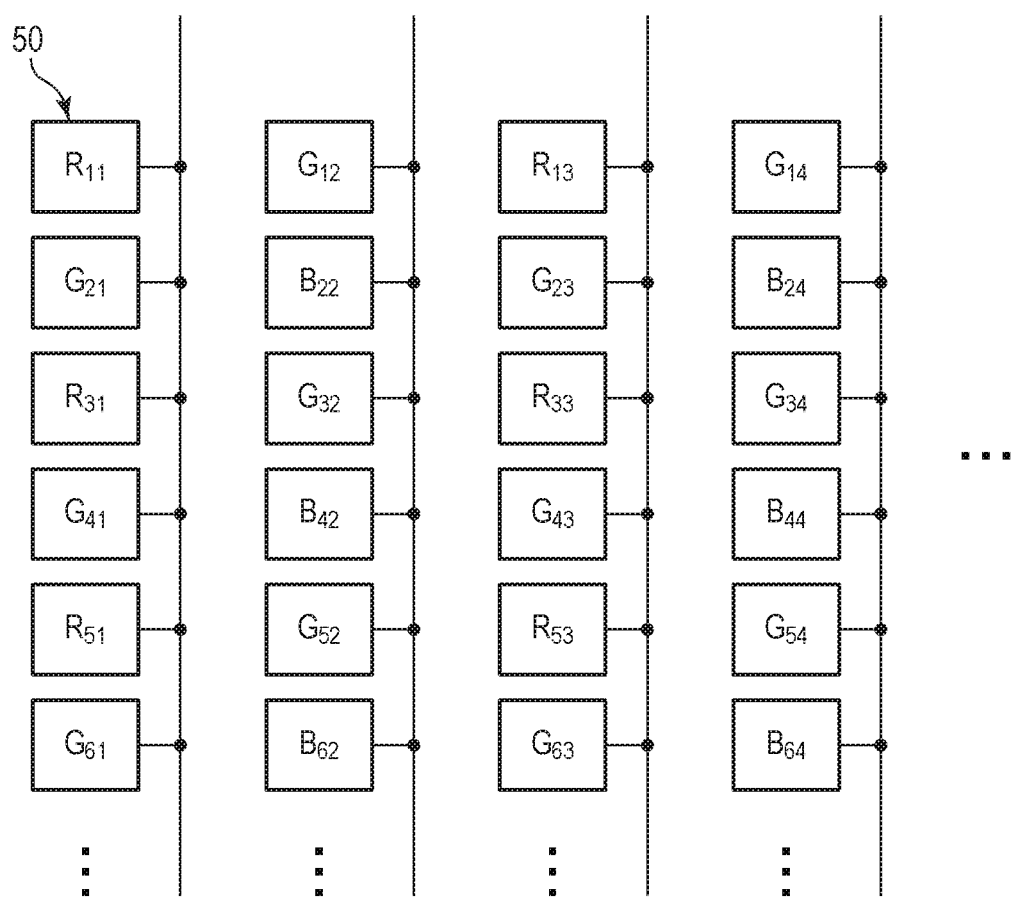
FIG. 3 illustrates a schematic diagram of the semiconducting device.

FIG. 3 illustrates an array of the pixels 50 in the area 13, which are one example of the cells 10 arranged in a plurality of rows and a plurality of columns shown in FIGS. 1A and 1B. FIG. 3 illustrates the colors of the color filters in the pixels 50 and the positions of the pixels 50. As for the position of the pixel 50, n and m are used which are natural numbers, and nm represents that the pixel is arranged in an n-th row and an m-th column. For example, the pixel 50 described as R11 means that the pixel has a red color filter, and is arranged in the first row and the first column. Similarly, the pixel 50 described as G12 means that the pixel has a green color filter, and is arranged in the first row and the second column. Similarly, the pixel 50 described as B22 means that the pixel has a blue color filter, and is arranged in the second row and the second column. As illustrated in FIG. 3, the array of the color filters in the pixels 50 in the present exemplary embodiment is a Bayer array.

Figure 4:
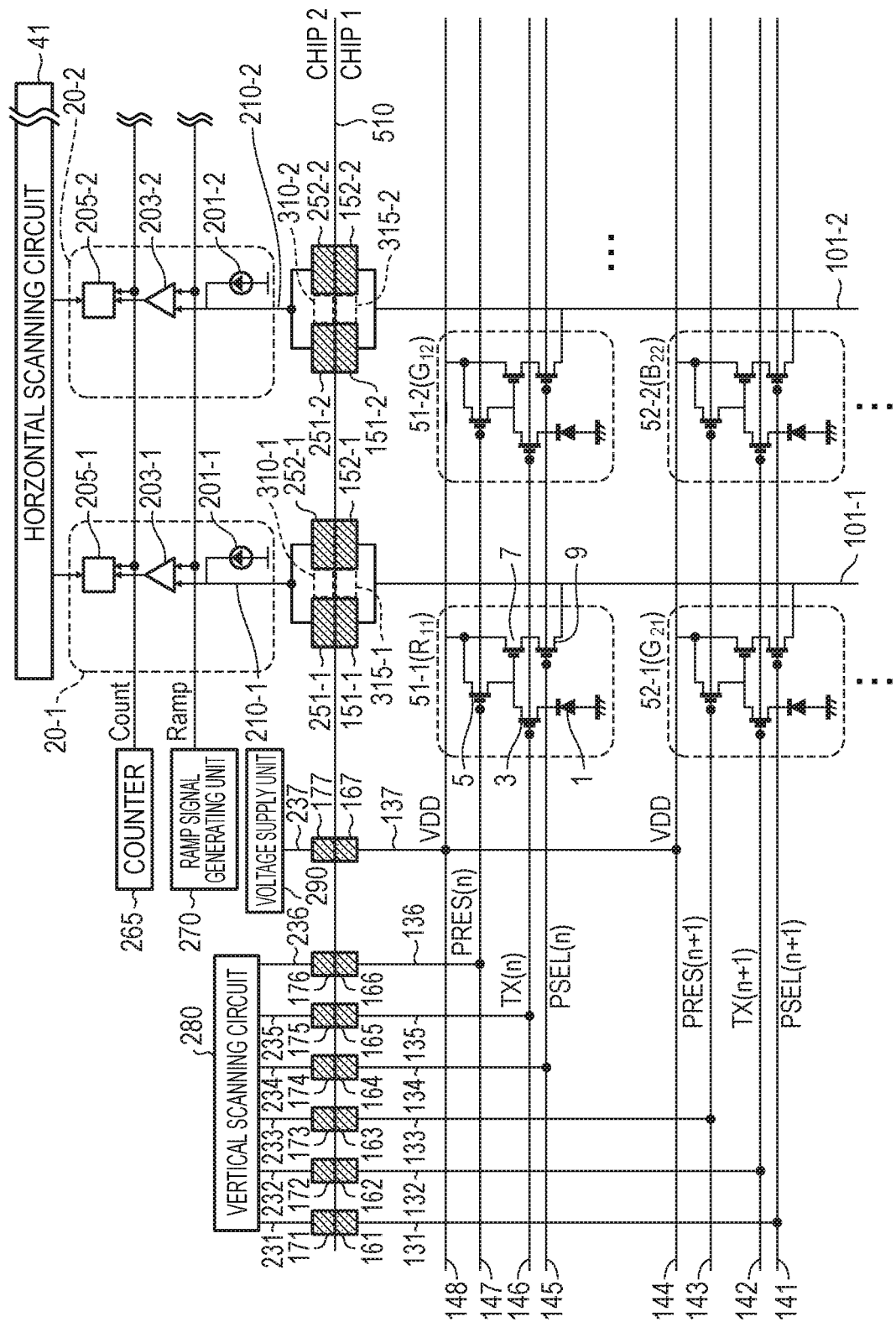
FIG. 4 illustrates a schematic diagram of the semiconducting device.

FIG. 4 illustrates a view illustrating a configuration of a semiconducting device of the present exemplary embodiment.

The pixels 50 illustrated in FIG. 3 are illustrated as pixels 51-1, 51-2, 52-1 and 52-2, in FIG. 4. In the following description, when items will be described which are common to the pixels 51-1, 51-2, 52-1 and 52-2, the reference character of the pixel shall be described as a pixel 5n.

The pixel 5n has a photoelectric conversion unit 1 which is typically a photodiode, a transfer transistor 3, a reset transistor 5, an amplification transistor 7 and a selection transistor 9.

Any of the conductive patterns which will be described later is the conductive pattern containing copper as the main component, which has been described above.

The gates of the transfer transistors 3 in the pixels 51-1 and 51-2 are connected to the vertical scanning circuit 280 provided on the chip 2, via a row controlling line 146, a connection controlling line 135, a conductive pattern 165, a conductive pattern 175 and a connection controlling line 235. Thereby, signals TX (n) are transmitted from the vertical scanning circuit 280 to the gates of the transfer transistors 3 in the pixels 51-1 and 51-2, respectively.

The gates of the reset transistors 5 in the pixels 51-1 and 51-2 are connected to the vertical scanning circuit 280 provided in the chip 2, via a row controlling line 147, a connection controlling line 136, a conductive pattern 166, a conductive pattern 176 and a connection controlling line 236. Thereby, signals PRES(n) are transmitted from the vertical scanning circuit 280 to the gates of the reset transistors 5 in the pixels 51-1 and 51-2, respectively. The reset transistor 5 is connected to a node (floating diffusion region) to which the amplification transistor 7 and the transfer transistor 3 are connected.

The gates of the selection transistors 9 in the pixels 51-1 and 51-2 are connected to the vertical scanning circuit 280 provided in the chip 2, via the row controlling line 146, a connection controlling line 134, a conductive pattern 164, a conductive pattern 174 and a connection controlling line 234. Thereby, signals PSEL(n) are transmitted from the vertical scanning circuit 280 to the gates of the selection transistors 9 in the pixels 51-1 and 51-2, respectively.

The connection controlling lines 231 to 236 are first controlling lines which connect the vertical scanning circuit 280 to the corresponding conductive patterns 171 to 176, respectively.

The connection controlling lines 131 to 136 are second controlling lines which connect the corresponding row controlling lines 141 to 143 and 145 to 147 to the conductive patterns 161 to 166, respectively.

In addition, a vertical scanning circuit 280 is a controlling unit which controls a plurality of rows of pixels 5n on a row-by-row basis.

In addition, a voltage supplying unit 290 is a controlling unit that supplies a power supply voltage VDD which is a driving voltage, to the pixel 5n.

The connection controlling line 134 is formed in a wiring layer that is closer to the conductive pattern 164 than a wiring layer in which a row controlling line 145 is provided. As for the configuration of FIG. 2, the connection controlling line 134 is provided in the type A of the same layer as the wiring layer in which the wire 123 denoted by the type H is provided. In addition, a row controlling line 146 is provided in the type A of the same layer as the wiring layer in which the wire 122 denoted by the type H is provided.

Similarly, the connection controlling line 135 is formed in a wiring layer that is closer to the conductive pattern 165 than a wiring layer in which the row controlling line 146 is provided.

Similarly, the connection controlling line 136 is formed in a wiring layer that is closer to the conductive pattern 166 than a wiring layer in which the row controlling line 147 is provided.

The power supply voltage VDD is supplied to respective main nodes (typically, drains) of the reset transistor 5 and the amplification transistor 7, from the voltage supplying unit 290 which the chip 2 has. An electrical path through which the power supply voltage VDD is supplied includes a voltage line 144, a voltage line 148, a connection voltage line 137, a conductive pattern 167, a conductive pattern 177 and a connection voltage line 237.

The respective gates of the transfer transistor 3, the reset transistor 5 and the selection transistor 9 in each of the pixels 52-1 and 52-2 are connected to the vertical scanning circuit 280 via the corresponding connection controlling lines and the corresponding conductive patterns 161-163 and 171-173. Each of the conductive patterns 161 to 167 is one example of a fifth conductive pattern. In addition, each of the conductive patterns 171 to 177 is one example of a sixth conductive pattern.

The respective output nodes (sources) of the selection transistors 9 in the pixels 51-1 and 52-1 are connected to the signal line 101-1. In addition, the respective output nodes (sources) of the selection transistors 9 in the pixels 51-2 and 52-2 are connected to the signal line 101-2. In other words, each of the plurality of signal lines 101-1 and 101-2 is arranged so as to correspond to one column among a plurality of columns in which a plurality of pixels 5n are arranged. However, the present exemplary embodiment is not limited to this example, and a plurality of signal lines 101 may be arranged for one column of pixels 5n. In addition, an example may be employed in which a plurality of columns of pixels 5n are connected to one signal line 101.

The signal line 101-1 is connected to a first conductive pattern 151-1 and a second conductive pattern 152-1. In addition, the first conductive pattern 151-1 and the second conductive pattern 152-1 are joined to a third conductive pattern 251-1 and a fourth conductive pattern 252-1 which the chip 2 has, at a junction plane 510, respectively. This junction plane 510 corresponds to the junction plane 40 illustrated in FIG. 2. In the first conductive pattern 151-1 and the second conductive pattern 152-1, an insulation layer 315-1 is provided which corresponds to a part of the interlayer insulation film 120 illustrated in FIG. 2. In addition, in between the third conductive pattern 251-1 and a fourth conductive pattern 252-1, an insulation layer 310-1 is provided which corresponds to a part of the interlayer insulation film 220 illustrated in FIG. 2. In other words, in the present exemplary embodiment, insulation layers are arranged both in between the first conductive pattern 151-1 and the second conductive pattern 152-1, and in between the third conductive pattern 251-1 and the fourth conductive pattern 252-1.

The signal line 101-2 is connected to a first conductive pattern 151-2 and a second conductive pattern 152-2. In addition, the first conductive pattern 151-2 and the second conductive pattern 152-2 are joined to a third conductive pattern 251-2 and a fourth conductive pattern 252-2 which the chip 2 has, at the junction plane 510, respectively.

Incidentally, in this junction plane 510, the conductive pattern 161 and the conductive pattern 171, the conductive pattern 162 and the conductive pattern 172, and the conductive pattern 163 and the conductive pattern 173 are joined to each other, respectively. Furthermore, in the junction plane 510, the conductive pattern 164 and the conductive pattern 174, the conductive pattern 165 and the conductive pattern 175, the conductive pattern 166 and the conductive pattern 176, the conductive pattern 167 and the conductive pattern 177 are joined to each other, respectively.

A cell 20-1 which the chip 2 has is connected to the third conductive pattern 251-1 and the fourth conductive pattern 252-1, via a signal line 210-1 (second signal line). In the present exemplary embodiment, each of the plurality of cells 20 is an AD converter that converts the pixel signal which the corresponding pixel 5n outputs, into a digital signal.

Specifically, a current source 201-1 which the chip 2 has is connected to a third conductive pattern 251-1 and a fourth conductive pattern 252-1. This current source 201-1 supplies an electric current to the amplification transistor 7 connected to the selection transistor 9 to which a signal PSEL in an active level has been input. A current supply path from the current source 201-1 to the amplification transistor 7 includes the third conductive pattern 251-1, the fourth conductive pattern 252-1, the first conductive pattern 151-1, the second conductive pattern 152-1 and the signal line 101-1.

In addition, to the third conductive pattern 251-1 and the fourth conductive pattern 252-1, a comparator 203-1 which the chip 2 has is connected. To the comparator 203-1, a ramp signal Ramp is supplied from a ramp signal generating unit 270. The ramp signal Ramp is a reference signal of which the potential changes with the lapse of time. As the ramp signal generating unit 270, for example, a DAC (digital-to-analog converter) or an integrating circuit can be used which integrates an electric current in a capacitor. The ramp signal Ramp is supplied in common, to a plurality of comparators 203 which cells 20 in a plurality of columns have.

The comparator 203 outputs a signal of a comparison result which has been obtained by comparing a signal level of the pixel signal which is input from the corresponding signal line 101 and is output from the pixel 5n, with the signal level of the ramp signal Ramp, to a memory 205 in the subsequent stage. The signal level of the signal of the comparison result changes at the timing corresponding to the timing at which the magnitude relationship between the signal level of the pixel signal and the signal level of the ramp signal Ramp is reversed.

A counter 265 counts the clock signal, after the ramp signal generating unit 270 has started changing the potential according to the lapse of time of the ramp signal Ramp. Thereby, the counter 265 counts the time which has elapsed after the ramp signal generating unit 270 started changing the potential according to the lapse of time of the ramp signal Ramp. The counter 265 outputs the counted signal to the memory 205 which each of the cells 20 in the plurality of columns has, as a count signal Count.

The memory 205 holds the count signal Count at the timing, in response to the change in the signal level of the signal of the comparison result, which is output from the corresponding comparator 203. The count signal Count held by the memory 205 has a value corresponding to the elapsed time up to the time when the signal level of the signal of the comparison result changes after the potential of the ramp signal Ramp starts changing. Therefore, the count signal Count held by the memory 205 is a digital signal corresponding to the pixel signal.

The horizontal scanning circuit 41 which the chip 2 has sequentially scans the memories 205 in the cells 20 in each column. Thereby, digital signals corresponding to pixel signals are sequentially output from the memories 205 in the cells 20 in each column, to an unillustrated output line.

Here, the correspondence relation between the joining pattern illustrated in FIG. 2 and the joining pattern of each conductive pattern in the present exemplary embodiment will be described.

The joining patterns of the first conductive pattern 151-1, the second conductive pattern 152-1, the third conductive pattern 251-1 and the fourth conductive pattern 252-1 correspond to the joining pattern of B illustrated in FIG. 2. Specifically, one of the conductive patterns 1244 and 1245 illustrated in FIG. 2 is the first conductive pattern 151-1, and the other is the second conductive pattern 152-1. In addition, one of the conductive patterns 2244 and 2245 illustrated in FIG. 2 is the third conductive pattern 251-1, and the other one is the fourth conductive pattern 252-1.

Furthermore, the joining of the conductive patterns 161 and 171 corresponds to the joining pattern of A illustrated in FIG. 2. Specifically, the conductive pattern 1241 illustrated in FIG. 2 is the conductive pattern 161. In addition, the conductive pattern 2241 illustrated in FIG. 2 is the conductive pattern 171. Similarly, the joining of the signal line of another signal which the vertical scanning circuit 280 outputs can also be the joining pattern of A in FIG. 2.

In addition, the joining of the conductive patterns 167 and 177 may be any one of the patterns A to H illustrated in FIG. 2. In order to stabilize the voltage of the power supply voltage VDD, it is acceptable to supply the power supply voltage VDD by using a plurality of contacts 210 as in E to H.

In the present exemplary embodiment, a plurality of junction portions are provided as a junction portion at which the cell 20 is connected with the signal line 101-1. The plurality of junction portions are a first junction portion between the first conductive pattern 151-1 and the third conductive pattern 251-1, and a second junction portion between the second conductive pattern 152-1 and the fourth conductive pattern 252-1. Thereby, even if one of the first junction portion and the second junction portion causes a joining failure, the other junction portion is joined, and thereby electrical conduction between the signal line 101-1 and the cell 20 can be obtained. Specifically, the plurality of junction portions provide an adequate connection between the chips in the signal line 101-1 and signal line 210-1 that are the paths which transmit the pixel signals therethrough.

Thus, the semiconducting device of the present exemplary embodiment has a plurality of junction portions provided therein, and thereby can provide adequate connection between chips in a path which transmits pixel signals therethrough.

Incidentally, in the present exemplary embodiment, the pixel 5n has included the selection transistor 9, but the disclosure is not limited to this example. As for another example, the amplification transistor 7 may be connected to the signal line 101 not by way of the transistor. In this case, the semiconducting device shall be configured to be capable of inputting one of the plurality of power supply voltages (for example, VDD1 and VDD2), for the potential of the drain of the reset transistor 5. VDD1 shall represent a power supply voltage of the drain of a reset transistor 5 of a pixel 5n in a row from which the pixel signal is not read out. Then, the potential of the gate (floating diffusion region) of the amplification transistor 7 shall be set at the potential corresponding to the power supply voltage VDD1, by the reset transistor 5 being turned on. This potential is such a voltage that a voltage between the gate and the source of the amplification transistor 5 becomes smaller than a threshold voltage. Accordingly, the amplification transistor 5 of the pixel 5n in the row from which the pixel signal is not read out becomes an off state. On the other hand, VDD2 shall represent a power supply voltage of the drain of a reset transistor 5 of a pixel 5n in a row from which the pixel signal is read out. Then, the potential of the gate (floating diffusion region) of the amplification transistor 7 shall be set at the potential corresponding to the power supply voltage VDD2, by the reset transistor 5 being turned on. This potential is such a potential that a voltage between the gate and the source of the amplification transistor 5 becomes larger than the threshold voltage. Accordingly, the amplification transistor 5 of the pixel 5n in the row from which the pixel signal is read out becomes an on state. Thus, the semiconducting device can select the row from which the pixel signal is read out and the row from which the pixel signal is not read out, even in a configuration in which the pixel 5n does not have the selection transistor 9.

Exemplary Embodiment 2

In a semiconducting device of the present exemplary embodiment, points different from those in Exemplary Embodiment 1 will be mainly described.

In the semiconducting device of Exemplary Embodiment 1, insulation layers were arranged both in between the first conductive pattern 151-1 and the second conductive pattern 152-1, and in between the third conductive pattern 251-1 and the fourth conductive pattern 252-1. The present exemplary embodiment has a form in which the insulation layer is arranged between the first conductive pattern 151-1 and the second conductive pattern 152-1, and the insulation layer is not arranged between the third conductive pattern 251-1 and the fourth conductive pattern 252-1.

Figure 5:
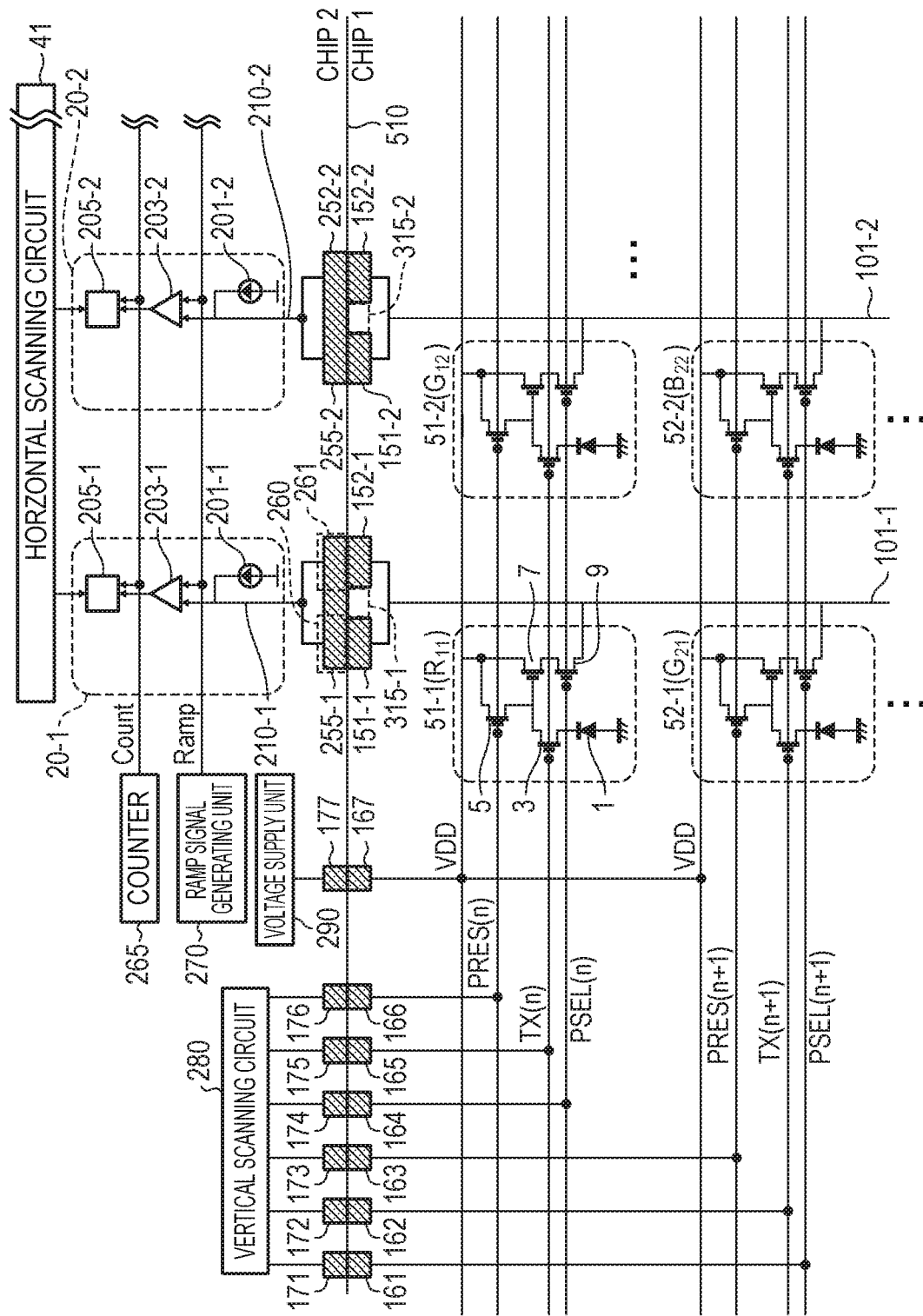
FIG. 5 illustrates a schematic diagram of a semiconducting device.

FIG. 5 is a diagram illustrating a configuration of the semiconducting device of the present exemplary embodiment.

To the members having the same functions as the members illustrated in FIG. 4, the same reference characters as the reference characters assigned in FIG. 4 are assigned also in FIG. 5.

Also in the present exemplary embodiment, the insulation layer 315-1 is arranged between the first conductive pattern 151-1 and the second conductive pattern 152-1. On the other hand, the present exemplary embodiment has a conductive pattern 255-1 which includes a third conductive pattern 260 and a fourth conductive pattern 261. Specifically, the conductive pattern 255-1 includes the third conductive pattern 260 which is joined to the first conductive pattern 151-1, and the fourth conductive pattern 261 which is joined to the second conductive pattern 152-1. However, the insulation layer is not arranged between the third conductive pattern 260 and the fourth conductive pattern 261.

Even in such a joining form, even though a joining failure occurs in one of the joining between the first conductive pattern 151-1 and the third conductive pattern 260, and the joining between the second conductive pattern 152-1 and the fourth conductive pattern 261, the semiconducting device can join the patterns to each other in the other joining. Thereby, similarly to the semiconducting device of Exemplary Embodiment 1, the semiconducting device has a plurality of junction portions, and thereby can provide adequate connection between the chips in the path which transmits the pixel signals therethrough.

Incidentally, in the present exemplary embodiment, the insulation layer 315-1 is arranged between the first conductive pattern 151-1 and the second conductive pattern 152-1, and the insulation layer is not arranged between the third conductive pattern 260 and the fourth conductive pattern 261. As another example, a reverse configuration of the present exemplary embodiment is also acceptable. In other words, it is also acceptable that the insulation layer is not arranged between the first conductive pattern 151-1 and the second conductive pattern 152-1, and the insulation layer is arranged between the third conductive pattern 260 and the fourth conductive pattern 261.

Exemplary Embodiment 3

In a semiconducting device of the present exemplary embodiment, points different from those in Exemplary Embodiment 1 will be mainly described.

In the semiconducting device of the present exemplary embodiment, the chip 2 has connection switches 60 which connect a plurality of signal lines 210-n to each other.

Figure 6:
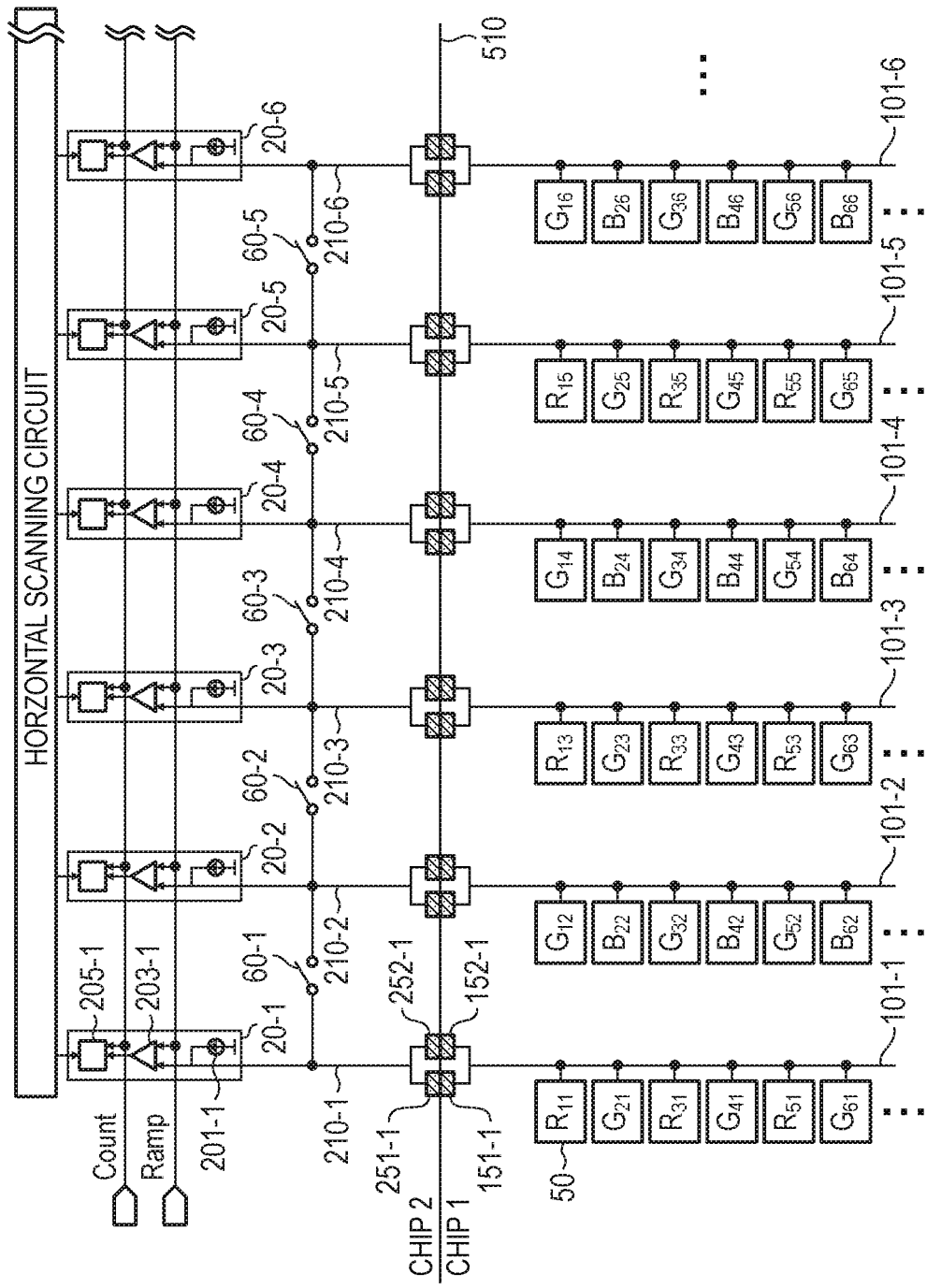
FIG. 6 illustrates a schematic diagram of a semiconducting device.

FIG. 6 is a diagram illustrating a configuration of the semiconducting device of the present exemplary embodiment. To the members having the same functions as the members illustrated in FIG. 4, the same reference characters as the reference characters assigned in FIG. 4 are assigned also in FIG. 6.

In the semiconducting device of the present exemplary embodiment, the chip 2 has connection switches 60 which connect a plurality of signal lines 210-n to each other. By having this connection switch 60, the semiconducting device can obtain a signal which has been obtained by binning each of pixel signals of pixels 5n in a plurality of columns as one signal. Incidentally, the connection switches 60-1 to 60-5 can arbitrarily change the number of connection switches which are in a conductive state, according to the number of columns of the signal lines 210-n to be connected. For example, if all of the connection switches 60-1 to 60-5 are in a conductive state, the pixel signals output to the signal lines 101-1 to 101-6 can be binned as one signal.

In the present exemplary embodiment, the semiconducting device is configured so that the chip 2 has the connection switch 60. The connection switch 60 can be provided rather on the chip 2 than on the chip 1. Generally, the signal line 101 is provided in a semiconductor layer that is formed on the lower part of the semiconductor substrate on which the pixels 50 are formed (on surface side opposing to plane of light incidence). Accordingly, in one embodiment, when a connection switch (which is formed in semiconductor substrate) which connects a plurality of signal lines 101 to each other is provided in the chip 2, a contact which connects the connection switch with the signal line 101 is further provided. There occur an increase in the number of steps for providing this contact, an increase in a parasitic capacitance of the signal line 101 due to the contact, and restrictions on the wiring layout of the signal line 101 and other wires due to the contact. In some cases, an area of the photoelectric conversion unit 1 in a plan view decreases.

On the other hand, in the case where the connection switch 60 is provided in the chip 2, it can be made unnecessary to further add the contact because of the installation of the connection switch 60. Accordingly, in the case where the connection switch 60 is provided, the connection switch 60 can be provided rather in the chip 2 than in the chip 1.

Thus, the semiconducting device of the present exemplary embodiment can suitably perform the binning of the pixel signals of each of the pixels 5n in the plurality of columns.

Exemplary Embodiment 4

In a semiconducting device of the present exemplary embodiment, points different from those in Exemplary Embodiment 3 will be mainly described.

The semiconducting device of the present exemplary embodiment has a form in which a plurality of signal lines 111-1 and 111-2 are arranged with respect to one column of pixels 5n.

Figure 7:
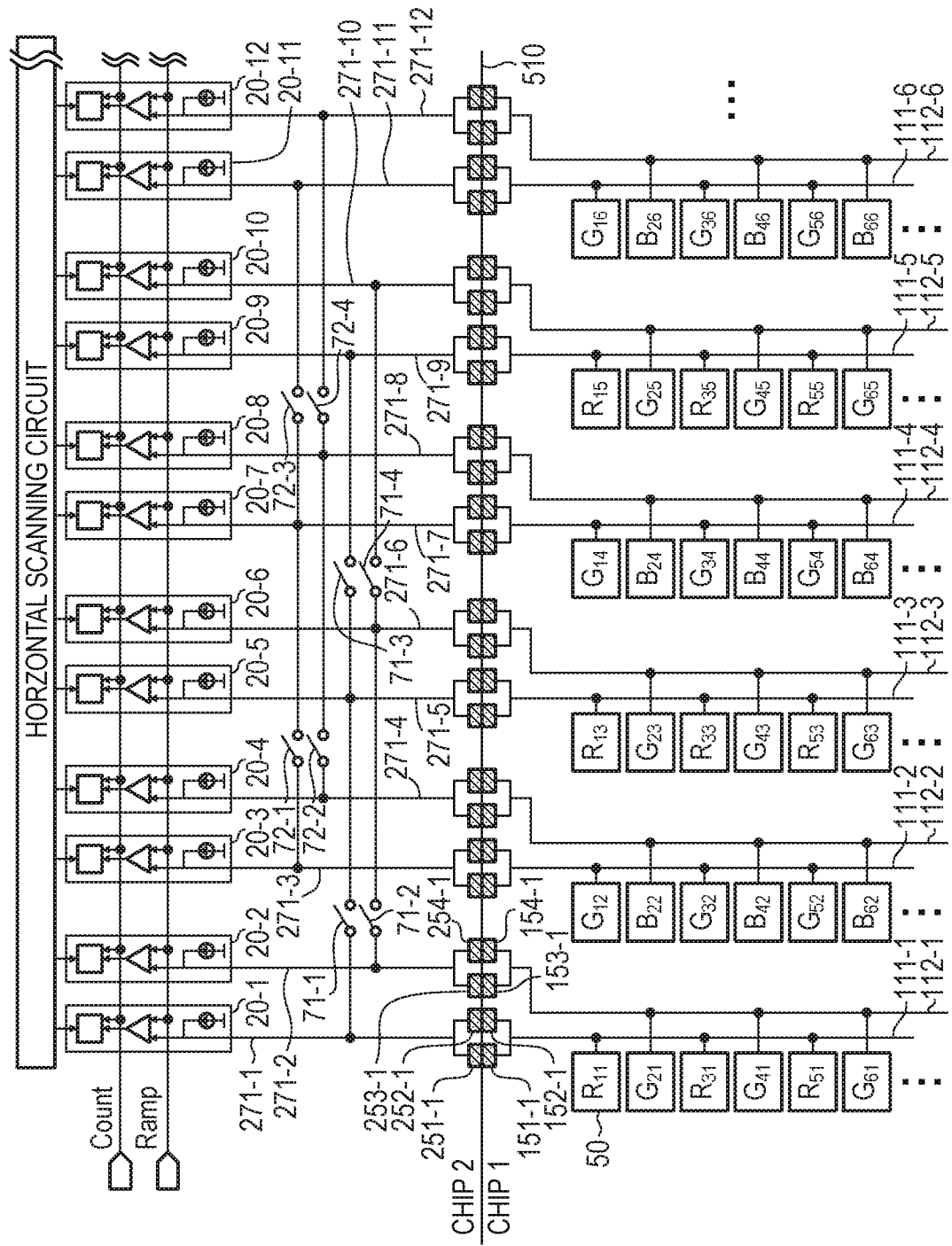
FIG. 7 illustrates a schematic diagram of a semiconducting device.

FIG. 7 is a diagram illustrating a configuration of the semiconducting device according to the present exemplary embodiment. To the members having the same functions as the members illustrated in FIG. 6, the same reference characters as the reference characters assigned in FIG. 6 are assigned also in FIG. 7.

The semiconducting device of the present exemplary embodiment has a plurality of signal lines 111 and 112 arranged with respect to one column of pixels 5n.

This signal line 111-1 is connected to the signal line 271-1 via the conductive patterns 151-1, 152-1, 251-1 and 252-1. In addition, a signal line 111-2 is connected to a signal line 271-2 via conductive patterns 153-1, 154-1, 253-1 and 254-1.

The signal line 271-1, a signal line 271-5 and a signal line 271-9 which are arranged so as to correspond to the pixels 5n in odd-numbered columns are connected to each other via a connection switch 71-1. In addition, the signal line 271-2, a signal line 271-6 and a signal line 271-10 which are arranged so as to correspond to pixels 5n in even-numbered columns are connected to each other via a connection switch 71-2. Thus, a plurality of signal lines 271 corresponding to each of an n-th column, an n+4th column and an n+8th column are connected to each other via connection switches 70.

Thus, the semiconducting device of the present exemplary embodiment can perform the binning of each of the pixel signals which have been output to signal lines 111 in the three columns to one signal.

Thereby, the semiconducting device of the present exemplary embodiment can perform the binning of more pixel signals to one signal than the semiconducting device of Exemplary Embodiment 3.

Exemplary Embodiment 5

In a semiconducting device of the present exemplary embodiment, points different from those in Exemplary Embodiment 4 will be mainly described.

The semiconducting device of the present exemplary embodiment has FD connection switches that connect nodes (floating diffusion region) to each other, which each of the pixels 5n has and to which the amplification transistor 7 and the transfer transistor 3 are connected, in a plurality of pixels 5n in the odd-numbered rows, and that connect nodes in a plurality of pixels 5n in the even-numbered rows to each other.

Figure 8:
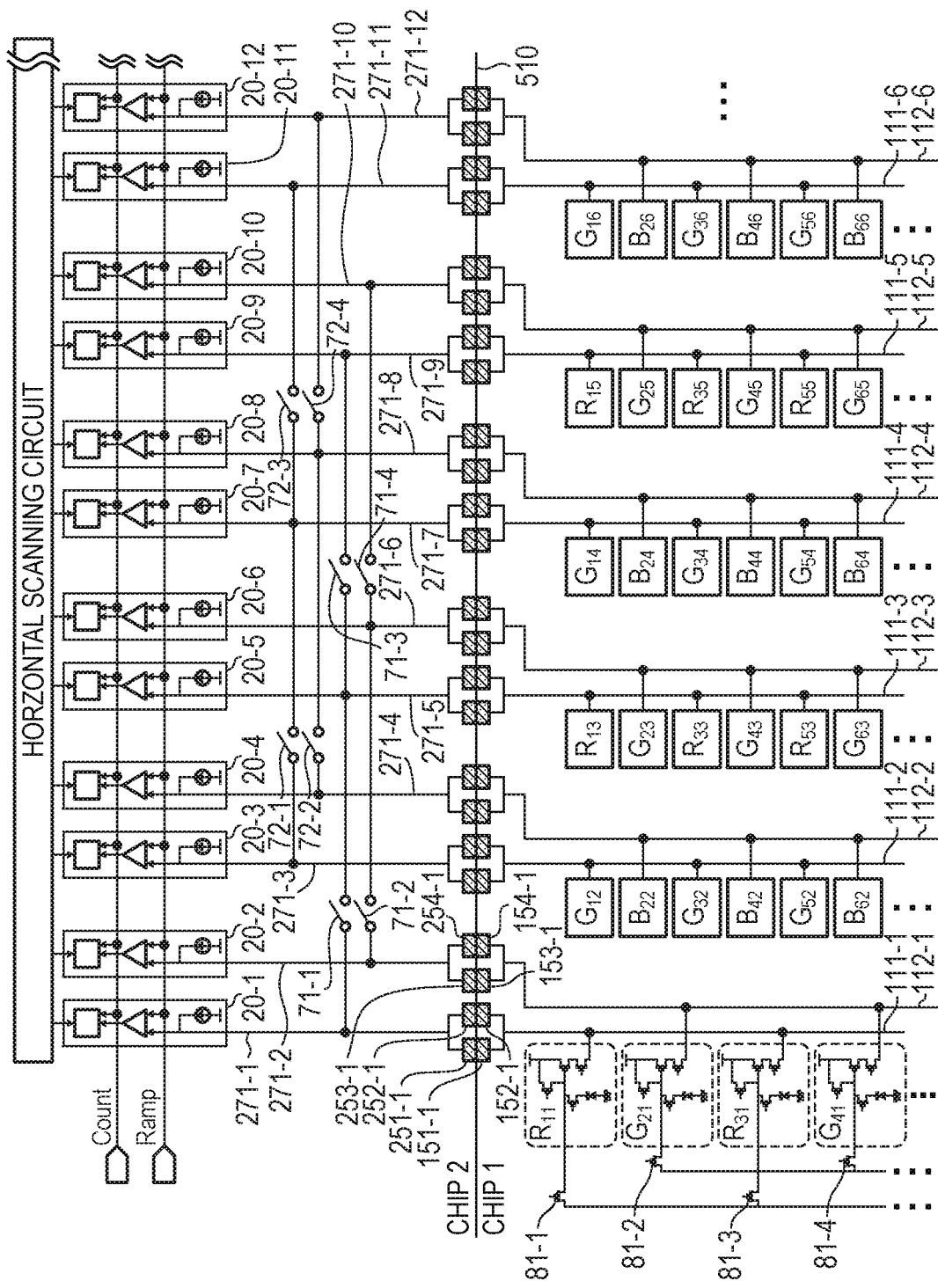
FIG. 8 illustrates a schematic diagram of a semiconducting device.

FIG. 8 is a diagram illustrating the configuration of the semiconducting device of the present exemplary embodiment. To the members having the same functions as the members illustrated in FIG. 7, the same reference characters as the reference characters assigned in FIG. 7 are assigned also in FIG. 8.

The semiconducting device of the present exemplary embodiment has the FD connection switches 81 as described above. By making the FD connection switch 81 conductive, the semiconducting device can add (average) electric charges which the photoelectric conversion units 1 of the plurality of pixels 5n have accumulated. Thereby, the semiconducting device can perform the binning of more pixel signals of pixels 5n to one signal than the semiconducting device of Exemplary Embodiment 4.

Effect of the Invention

According to the aspect of the embodiments, the semiconducting device can provide adequate connection between chips in a path for transmitting pixel signals.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-068576, filed Mar. 30, 3018, which is hereby incorporated by reference herein in its entirety.

What is claimed is:

1. A semiconducting device comprising:
a first chip having a plurality of pixels that are arranged over a plurality of rows and a plurality of columns, each pixel having a photoelectric conversion unit and an output node which outputs a signal level corresponding to an electric charge of the photoelectric conversion unit;
a plurality of signal lines to which output nodes of respective pixels in the plurality of rows of a corresponding column among the plurality of columns are connected, respectively; and
a second chip in which a plurality of cells are arranged, wherein
the first chip has a first conductive pattern and a second conductive pattern which are connected to one signal line among the plurality of signal lines, respectively, the first conductive pattern and the second conductive pattern each containing copper as a main component, and
the second chip has a third conductive pattern and a fourth conductive pattern which are connected to one cell among the plurality of cells, respectively, the third conductive pattern and the fourth conductive pattern each containing copper as a main component, wherein
the first conductive pattern and the third conductive pattern are joined to each other on a junction plane, and the second conductive pattern and the fourth conductive pattern are joined to each other on the junction plane, and
an insulation layer is arranged at least in one of spaces between the first conductive pattern and the second conductive pattern, and between the third conductive pattern and the fourth conductive pattern.

2. The semiconducting device according to claim 1, wherein an insulation layer is arranged in both of the spaces between the first conductive pattern and the second conductive pattern, and between the third conductive pattern and the fourth conductive pattern.

3. The semiconducting device according to claim 1, wherein
the second chip further has a controlling unit that controls the plurality of pixels, and a first controlling line;
the first chip further has a second controlling line; and
the semiconducting device further has a fifth conductive pattern that the first chip includes and a sixth conductive pattern that the second chip includes, which are joined to each other on the junction plane, wherein the controlling unit and the plurality of pixels are connected to each other via the first controlling line, the fifth conductive pattern, the sixth conductive pattern and the second controlling line; and a number of conductive patterns including the first conductive pattern and the second conductive pattern, which are connected to the one signal line in the first chip, is smaller than a number of conductive patterns including the fifth conductive pattern, which are connected to the second controlling line in the first chip.

4. The semiconducting device according to claim 2, wherein the second chip further has a controlling unit that controls the plurality of pixels, and a first controlling line;

the first chip further has a second controlling line; and the semiconducting device further has a fifth conductive pattern that the first chip includes and a sixth conductive pattern that the second chip includes, which are joined to each other on the junction plane, wherein the controlling unit and the plurality of pixels are connected to each other via the first controlling line, the fifth conductive pattern, the sixth conductive pattern and the second controlling line; and a number of conductive patterns including the first conductive pattern and the second conductive pattern, which are connected to the one signal line in the first chip, is smaller than a number of conductive patterns including the fifth conductive pattern, which are connected to the second controlling line in the first chip.

5. The semiconducting device according to claim 3, wherein the first chip further has a row controlling line that is connected to the second controlling line and a plurality of pixels in one row among the plurality of rows, and a wiring layer in which the second controlling line is arranged is arranged between a wiring layer in which the row controlling line is arranged and the fifth conductive pattern.

6. The semiconducting device according to claim 4, wherein the first chip further has a row controlling line that is connected to the second controlling line and a plurality of pixels in one row among the plurality of rows, and a wiring layer in which the second controlling line is arranged is arranged between a wiring layer in which the row controlling line is arranged and the fifth conductive pattern.

7. The semiconducting device according to claim 3, wherein the controlling unit is a vertical scanning circuit that scans the plurality of pixels in each row of the plurality of rows.

8. The semiconducting device according to claim 4, wherein the controlling unit is a vertical scanning circuit that scans the plurality of pixels in each row of the plurality of rows.

9. The semiconducting device according to claim 5, wherein the controlling unit is a vertical scanning circuit that scans the plurality of pixels in each row of the plurality of rows.

10. The semiconducting device according to claim 6, wherein the controlling unit is a vertical scanning circuit that scans the plurality of pixels in each row of the plurality of rows.

11. The semiconducting device according to claim 3, wherein the controlling unit is a voltage supplying unit that supplies a driving voltage to the plurality of pixels.

12. The semiconducting device according to claim 1, wherein the second chip further has a plurality of second signal lines each of which is connected to a corresponding one cell among the plurality of cells, the plurality of third conductive patterns, and the plurality of fourth conductive patterns, wherein the plurality of second signal lines are provided with respect to the plurality of third conductive patterns and the plurality of fourth conductive patterns so that one of the plurality of third conductive patterns and one of the plurality of fourth conductive patterns are connected to one of the plurality of second signal lines, and the semiconducting device further has a switch which connects the plurality of second signal lines to each other.

13. The semiconducting device according to claim 3, wherein the second chip further has a plurality of second signal lines each of which is connected to a corresponding one cell among the plurality of cells, the plurality of third conductive patterns, and the plurality of fourth conductive patterns, wherein the plurality of second signal lines are provided with respect to the plurality of third conductive patterns and the plurality of fourth conductive patterns so that one of the plurality of third conductive patterns and one of the plurality of fourth conductive patterns are connected to one of the plurality of second signal lines, and the semiconducting device further has a switch which connects the plurality of second signal lines to each other.

14. The semiconducting device according to claim 4, wherein the second chip further has a plurality of second signal lines each of which is connected to a corresponding one cell among the plurality of cells, the plurality of third conductive patterns, and the plurality of fourth conductive patterns, wherein the plurality of second signal lines are provided with respect to the plurality of third conductive patterns and the plurality of fourth conductive patterns so that one of the plurality of third conductive patterns and one of the plurality of fourth conductive patterns are connected to one of the plurality of second signal lines, and the semiconducting device further has a switch which connects the plurality of second signal lines to each other.

15. The semiconducting device according to claim 12, wherein the switch connects a plurality of second signal lines to each other, each of which corresponds to pixels in odd-numbered columns among the plurality of columns, among the plurality of second signal lines.

16. The semiconducting device according to claim 12, wherein pixels in odd-numbered columns among the plurality of columns have color filters of a first color, pixels in even-numbered columns among the plurality of columns have color filters of a second color, and the switch connects a plurality of second signal lines to each other, each of which corresponds to pixels in the odd-numbered columns, among the plurality of second signal lines.

17. The semiconducting device according to claim 16, wherein pixels in the odd-numbered rows out of the pixels in the odd-numbered columns have color filters of the first color, pixels in the even-numbered rows out of the pixels in the odd-numbered columns have color filters of a third color, and the first chip further has a switch for adding electric charges of the photoelectric conversion units of each of the pixels in the odd-numbered rows out of the pixels in the odd-numbered columns.

18. The semiconducting device according to claim 1, wherein each of the plurality of cells includes an AD converter that converts a signal which the pixel outputs into a digital signal.

19. The semiconducting device according to claim 1, wherein each of the plurality of cells includes a current source that supplies an electric current to a corresponding signal line among the plurality of signal lines.

20. An appliance comprising: a semiconducting device according to claim 1, and a processing apparatus that generates an image by processing signals which the semiconducting device outputs.

* * * * *